(12) United States Patent
Menard

(10) Patent No.: US 8,779,464 B2
(45) Date of Patent: Jul. 15, 2014

(54) STARTING STRUCTURE AND PROTECTION COMPONENT COMPRISING SUCH A STARTING STRUCTURE

(75) Inventor: Samuel Menard, Tours (FR)

(73) Assignee: STMicroelectronics (Tours) SAS, Tours (FR)

(*) Notice: Subject to any disclaimer, the term of this patent is extended or adjusted under 35 U.S.C. 154(b) by 0 days.

(21) Appl. No.: 13/448,670

(22) Filed: Apr. 17, 2012

(65) Prior Publication Data
US 2012/0267679 A1 Oct. 25, 2012

(30) Foreign Application Priority Data
Apr. 22, 2011 (FR) .................................. 11 53491

(51) Int. Cl.
*H01L 29/87* (2006.01)
*H01L 29/74* (2006.01)
*H01L 33/00* (2010.01)

(52) U.S. Cl.
USPC ............... 257/109; 438/139; 257/E21.388; 257/107; 257/E29.002; 257/E29.337; 257/618

(58) Field of Classification Search
CPC .... H01L 29/87; H01L 29/74; H01L 29/66121
USPC .................................................. 257/109, 107
See application file for complete search history.

(56) References Cited

U.S. PATENT DOCUMENTS

| | | | | |
|---|---|---|---|---|
| 5,272,355 A * | 12/1993 | Namavar et al. | .................... | 257/3 |
| 5,285,078 A * | 2/1994 | Mimura et al. | .................... | 257/3 |
| 6,034,381 A * | 3/2000 | Pezzani | ......................... | 257/107 |
| 6,818,927 B2 * | 11/2004 | Simonnet | ..................... | 257/107 |
| 7,167,331 B1 | 1/2007 | Sutardja | | |
| 2002/0000565 A1 * | 1/2002 | Simmonet | ..................... | 257/109 |
| 2005/0161743 A1 * | 7/2005 | Voldman | ....................... | 257/360 |
| 2006/0125055 A1 * | 6/2006 | Menard | ......................... | 257/607 |
| 2009/0044863 A1 * | 2/2009 | Marder et al. | ................ | 136/263 |
| 2011/0003441 A1 * | 1/2011 | Krutsick | ..................... | 438/139 |

FOREIGN PATENT DOCUMENTS

WO    WO 2007111432 A1    10/2007

OTHER PUBLICATIONS

Bisi et al., Porous silicon: a quantum sponge structure for silicon based optoelectronics, 2000, Elsevier, Surface Science Reports 38, pp. 1-126.*
French Search Report and Written Opinion dated Aug. 19, 2011 from corresponding French Application No. 11/53491.
Remaki B et al: *Electrical Barrier Properties of Meso-Porous Silicon*, Materials Science and Engineering B, Elsevier Sequoia, Lausanne, CH, vol. 101, No. 1-3, 15 adt 2003 (Aug. 15, 2003), pp. 313-317, XP004438544.

(Continued)

*Primary Examiner* — Julia Slutsker
*Assistant Examiner* — Natalia Gondarenko
(74) *Attorney, Agent, or Firm* — Wolf, Greenfield & Sacks, P.C.

(57) ABSTRACT

A structure for starting a semiconductor component including a porous silicon layer in the upper surface of a semiconductor substrate. This porous silicon layer is contacted, on its upper surface side, by a metallization and, on its lower surface side, by a heavily-doped semiconductor region.

28 Claims, 3 Drawing Sheets

(56) References Cited

OTHER PUBLICATIONS

Barillaro G et al: *Validation of the Compatibility Between a Porous Silicon-Based Gas Sensor Technology and Standard Microelectronic Process*, IEEE Sensors Journal, IEEE Service Center, New York, NY, US, vol. 10, No. 4, Apr. 1, 2010 pp. 893-899, XP011290322.

Balagurov L A et al: *Electronic transport in porous silicon of low porosity made on a p<+.> substrate*, Materials Science and Engineering B, Elsevier Sequoia, Lausanne, CH, vol. 69-70, Jan. 1, 2000, pp. 127-131, XP004184315.

\* cited by examiner

STARTING STRUCTURE AND PROTECTION COMPONENT COMPRISING SUCH A STARTING STRUCTURE

CROSS REFERENCE TO RELATED APPLICATIONS

This application claims the priority benefit of French patent application number 11/53491, filed on Apr. 22, 2011, entitled STARTING STRUCTURE AND PROTECTION COMPONENT COMPRISING SUCH A STARTING STRUCTURE, which is hereby incorporated by reference to the maximum extent allowable by law.

BACKGROUND

1. Technical Field

Embodiments relate to a starting structure, and more specifically to a starting structure adapted to protection components on silicon and especially to vertical protection components such as Shockley diodes.

2. Discussion of the Related Art

FIG. 1 generally shows the simplified diagram of a protection device which turns on when a voltage greater than a threshold is applied between its main terminals. Protection device 1 is placed between terminals T1 and T2 and comprises, or is associated with, a starting device 3. When the voltage between terminals T1 and T2 exceeds a determined threshold, a current flows in starting device 3 and starts protection device 1.

FIG. 2A shows as an example the circuit diagram of a protection device formed of a Shockley diode (PNPN diode). Such a diode is equivalent to a thyristor TH having main anode and cathode terminals A and K, the thyristor anode being connected to its gate by an avalanche diode or Zener diode Z capable of breaking down when the voltage across it exceeds a threshold value.

An issue for the monolithic forming of such devices lies in the fact that the doping levels necessary for a proper operation of the thyristor are not always compatible with the forming of doping levels capable of forming an avalanche diode Z of desired avalanche voltage. Further, it is in practice difficult to reach all the desired threshold voltage values. It is especially difficult to form devices having breakdown voltages lower than 10 volts. Indeed, to reach such voltages, junctions should be provided between very heavily-doped P- and N-type areas, which are often difficult to form and to accurately adjust.

FIG. 2B is a very simplified cross-section view showing an embodiment of the Shockley diode illustrated in the form of a circuit diagram in FIG. 2A. Only the main elements of the structure have been shown, and especially by various means currently intended to ensure its voltage behavior at the component periphery.

The Shockley diode is made in vertical form from an N-type substrate 10. P-type wells, respectively 12 and 13, are formed on the upper surface side and on the lower surface side. Currently, the P wells are formed in several steps so that the lower P well extends relatively deeply into substrate 10, to limit the thickness of the N-type region, especially for protection devices of low turn-on voltage. Indeed, if this N-type region remains too thick, the Shockley diode will have a relatively high on-state voltage drop and poor dynamic performance.

On the upper surface side, an N-type layer 15 is formed in well 12. Layer 15 is conventionally provided with emitter short-circuits 16, that is, with regions where this layer is interrupted. At the periphery of well 12 is formed a heavily-doped N-type ring 17. As desired, this ring is formed at the same time as N-type layer 15 to limit the number of manufacturing steps. The junction between $N^+$ region 17 and upper well 12 plays the role of avalanche diode Z of FIG. 2A. When the diode corresponding to the junction between $N^+$-type ring 17 and P-type well 12 should have a relatively low avalanche voltage (smaller than 10 volts), P-type well 12 should be relatively heavily-doped (for example, at a doping level greater than $10^{18}$ atoms/cm$^3$). Lower well 13 is coated with an anode metallization A and the upper surface of N-type layer 15 is coated with a cathode metallization K. The upper and lower surfaces of the Shockley diode are coated with an insulating layer 19, at the locations where these surfaces should not be contacted by the anode or cathode metallizations.

The operation of this protection device is the following.

When a low positive voltage is applied between the anode and the cathode, the component is non-conductive. When this voltage exceeds the value of the breakdown voltage defined by $N^+$ region 17 and P well 12, a current tends to flow from anode well 13 through the forward junction between this well and substrate 10, and through the diode in avalanche between $N^+$ region 17 and P well 12, towards metallization K. This turns on PNPN thyristor 13-10-12-15.

Since $N^+P$ diode 17-12 sets the starting voltage of the component, the doping levels of these regions, and especially of P well 12, should be adjusted with a great accuracy. In practice, it is difficult to achieve breakdown voltages smaller than 10 volts and to finely adjust such breakdown voltages in this manner.

SUMMARY

An embodiment overcomes at least some of the disadvantages of known protection devices.

An embodiment provides a starting device which turns on when the voltage across it exceeds a determined threshold.

An embodiment provides such a device having a threshold voltage that can be finely adjusted, especially to low values smaller than 10 volts.

An embodiment provides a device which can be simply integrated in a monolithic component on silicon.

An embodiment provides applications of such a starting structure to monolithic break-over semiconductor components such as Shockley diodes.

Thus, an embodiment provides a structure for starting a semiconductor component, comprising a porous silicon layer arranged between two conductive regions.

According to an embodiment, the porous silicon layer is formed in the upper portion of a semiconductor substrate and is contacted, on the side of its upper surface, by a metallization and, on the side of its lower surface, by a heavily-doped semiconductor region.

An embodiment provides a vertical semiconductor component forming a Shockley diode formed in a silicon substrate, wherein the upper portion of the substrate contains a starting region such as hereabove.

According to an embodiment, the lower portion of the porous silicon starting region is connected to a main electrode formed on the opposite surface by a very heavily-doped conductive wall, and the upper surface of the porous silicon layer is connected by a metallization to an upper surface well of the diode.

The foregoing and other objects, features, and advantages will be discussed in detail in the following non-limiting description of specific embodiments in connection with the accompanying drawings.

BRIEF DESCRIPTION OF THE DRAWINGS

As usual in the representation of semiconductor components, FIGS. 2B, 4B, and 5A-5E are not to scale.

DETAILED DESCRIPTION

Figure 3:
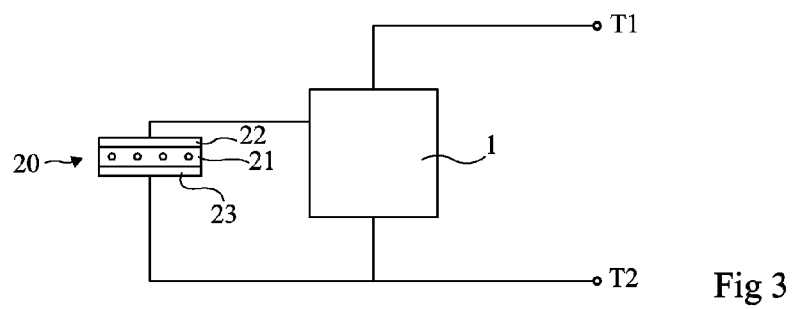
FIG. 3 generally shows a device which triggers beyond a threshold voltage, using a starting structure according to an embodiment.

As illustrated in FIG. 3, it is provided to use, as a starting structure for a protection device 1 turning on when the voltage between its terminals exceeds a threshold, a starting structure 20 formed of a thin porous silicon layer 21 connected between two electrodes 22 and 23.

The conduction in porous silicon has, for example, been studied in article "Electronic transport in PS of low porosity made on a P$^+$ substrate" by L. A. Balagurov, D. G. Yarkin, and E. A. Petrova, published in Materials Science and Engineering B69-70 (2000) pp. 127-131. More specifically, this article describes that, when a thin silicon layer arranged between two electrode sees the voltage thereacross increase, it switches from a first state where the conduction is limited by Ohm's law to a high conduction state (Child's law), the transition between the two states occurring when the voltage threshold has been reached. The threshold for passing from the low-conduction state to the high conduction state depends on the structure of the porous silicon and on the layer thickness.

It is here provided to use this phenomenon to form a starting structure.

Figure 4A:
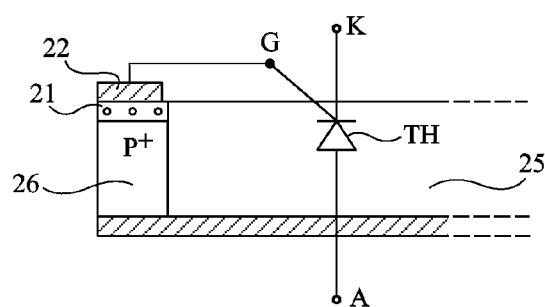
FIG. 4A schematically shows a Shockley diode incorporating a starting structure according to an embodiment.

FIG. 4A shows a one-way Shockley diode formed of a thyristor TH having an anode terminal A and a cathode terminal K. The starting structure between anode A and gate G of the thyristor corresponds to a porous silicon layer 21 formed in a silicon substrate 25. The lower surface of the porous silicon layer is connected to anode metallization A by a heavily-doped P-type well 26. The upper surface of the porous silicon layer is connected to the gate terminal of thyristor TH by metallization 22. Substrate 25 in which the porous silicon layer is formed also contains the elements forming thyristor TH.

Figure 4B:
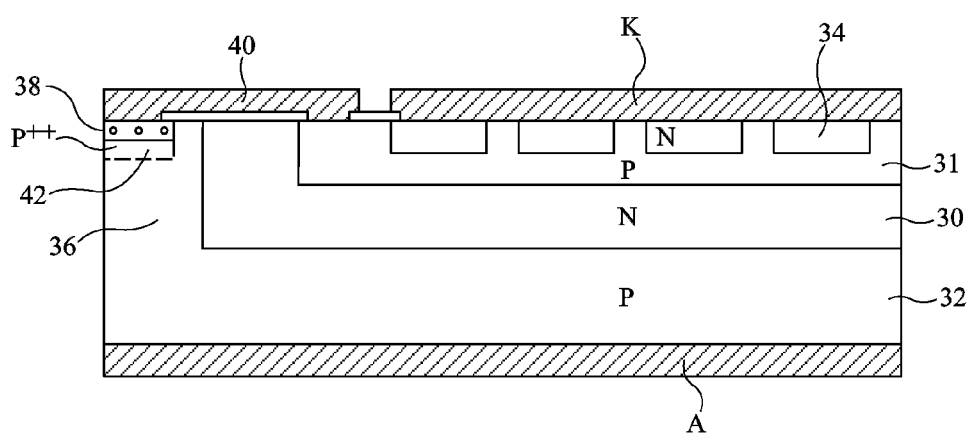
FIG. 4B is a cross-section view showing an embodiment in the form of a monolithic component of the circuit of FIG. 4A.

FIG. 4B is a cross-section view which shows as an example, in simplified manner, an embodiment of a Shockley diode turned on by a starting structure comprising a thin porous silicon layer. FIG. 4B shows a portion only (the left-hand portion) of a vertical Shockley diode component.

This component is formed from a lightly-doped N-type substrate 30. A P-type well 31 is formed on the upper surface side and a P-type well 32 is formed on the lower surface side of the substrate. In P-type well 31 is formed an N-type cathode layer 34 provided with emitter short-circuits. The well periphery is taken up by a P-type wall 36 which extends from the upper surface to the lower surface of the substrate. In the upper portion of wall 36 is formed a thin porous silicon layer 38. A cathode metallization K covers N-type layer 34, an anode metallization A covers the lower surface of the substrate, and a metallization 40 connects the upper portion of porous silicon layer 38 to P-type well 31. It should be understood that, preferably, porous silicon region 38 is a peripheral region surrounding the entire upper surface of the component. Preferably, the upper portion of P-type well 36 comprises, under porous silicon layer 38, a very heavily-doped P-type region 42, marked with P$^{++}$.

Thus, when the anode voltage is smaller than a determined threshold, only a current of very low amplitude (on the order of one microampere) flows between the anode and the cathode. However, as soon as the voltage between the anode and the cathode exceeds a determined threshold, silicon layer 38 enters its high-conduction (low resistance) state and a larger current (on the order of some ten milliamperes) flows from the anode through this layer 38, metallization 40, and P-type well 31 to cathode electrode K. This turns on PNPN thyristor 32-30-31-34 and the Shockley diode enters its protection mode.

FIGS. 5A to 5E illustrate an example of possible successive manufacturing steps of the component of FIG. 4B. These drawings are only intended to show that the component comprising a porous silicon starting structure may be simply manufactured by methods currently used in semiconductor component manufacturing.

Figure 5A:
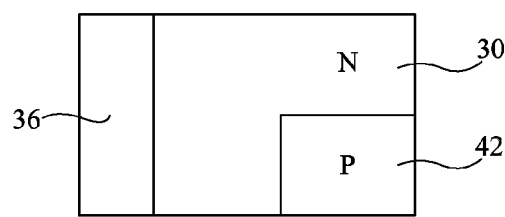
FIGS. 5A to 5E show possible steps of the forming of a one-way Shockley diode according to an embodiment.

FIG. 5A shows a lightly-doped N-doped substrate 30 having a heavily-doped P-type well 36 formed at its periphery and, on the lower surface side, a P-type well 42 extending in the substrate down to a desired depth so that the final component has, in the on state, a low voltage drop and better dynamic performances.

Figure 5B:
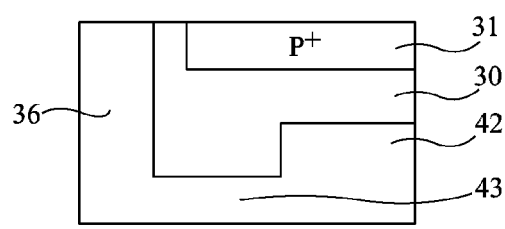

At the step illustrated in FIG. 5B, a P-type layer 43 has been formed over the entire lower surface side and a P-type well corresponding to well 31 of FIG. 4B has been formed on the upper surface side.

Figure 5C:
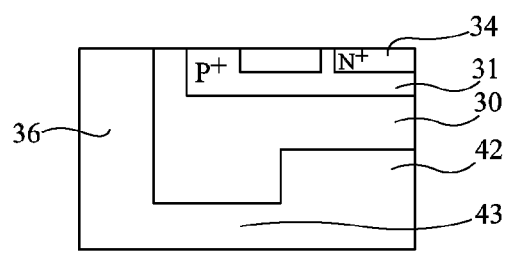

At the step illustrated in FIG. 5C, cathode layer 34 has been formed in P well 31.

Figure 5D:
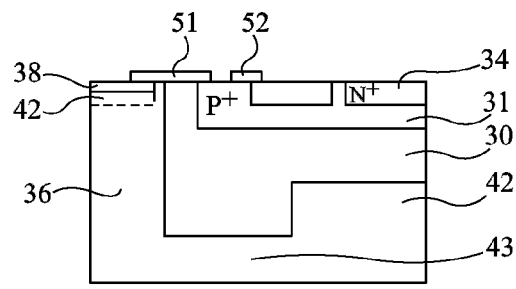

FIG. 5D shows the structure after it has been submitted to a masking, to a heavy P$^{++}$ implantation 42, and to a forming of porous silicon 38 by electrolytic etching in an electrolytic tank. FIG. 5D also shows insulating layers 51, 52, which are formed at the locations where it is not desired for upper metallizations to contact the underlying areas. It should be understood that insulating regions 51, 52 are ring-shaped in top view.

Figure 5E:
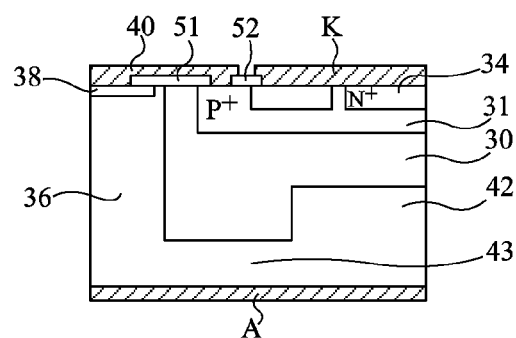

Finally, at the step illustrated in FIG. 5E, the forming of metallizations A, K, and 40 described in relation with FIG. 4B has been shown.

The forming conditions of the porous silicon layer, as well as the thickness of this layer, are selected so that the transition between a low-conduction operation and a high-conduction operation occurs for a given voltage value. For example, if the porous silicon is formed in an electrolytic tank in the presence of hydrofluoric acid and of ethanol by a proportion of 5 to 1, with a 13-mA/cm$^2$ current density and with an anodization time ranging from 1 to 25 minutes, porous silicon having a porosity ranging from 25 to 35% is obtained. The transition voltage then approximately ranges from 0.5 to 10 volts for layer thicknesses which vary from 1.7 µm to 5.7 µm. Of course, this is only a specific embodiment of the porous silicon layer and the conditions, temperatures, and anodization modes may be adjusted to obtain desired characteristics of the final layer. Further, although the porous silicon starting area has been shown as reaching the chip edge, it should be understood that its location may be selected differently.

Figure 1:
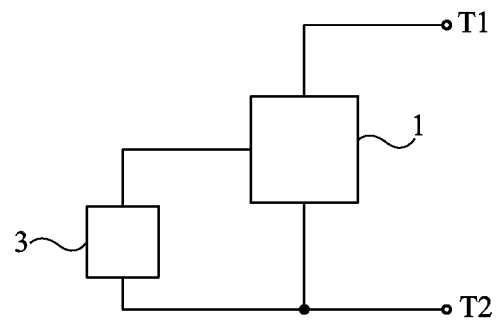
FIG. 1, previously described, shows in the form of blocks the simplified diagram of a starting protection component above a determined threshold voltage.
Figure 2A:
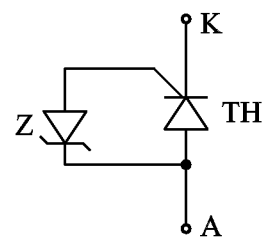
FIG. 2A, previously described, shows in the form of a circuit a one-way Shockley diode.
Figure 2B:
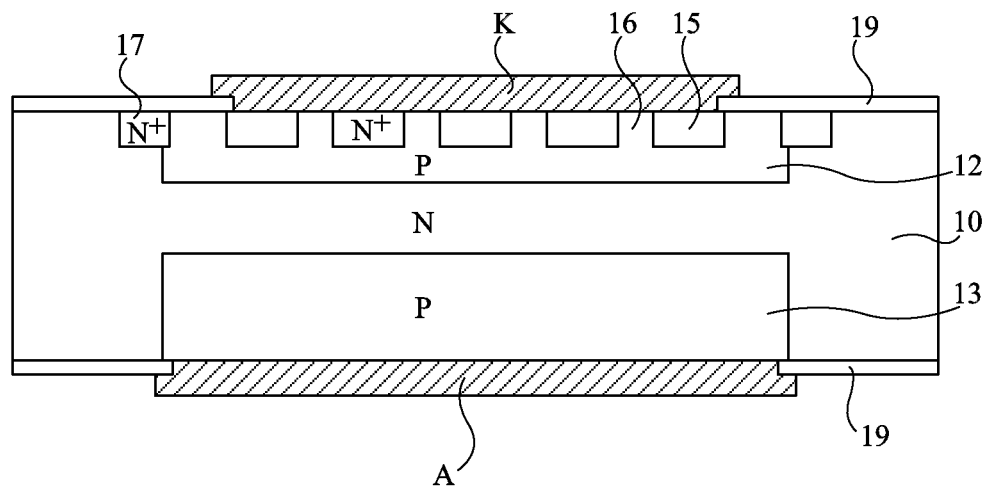
FIG. 2B, previously described, is a cross-section view showing in simplified manner the structure of a vertical one-way Shockley formed in a silicon substrate.

An advantage of the previously-described starting structure is that, as can be seen, the Shockley diode using such a starting structure will have a very low stray capacitance, while this stray capacitance is higher when the Shockley diode has a starting structure of avalanche diode type such as described in relation with FIG. 2B.

Another advantage of the structure according to the present invention is that the starting structure is much less temperature-dependent than in the case of a starting by avalanche diode.

Although embodiments have been described in relation with specific embodiments, and more specifically in the case of the starting of a one-way Shockley diode structure, it should be understood that all that has been previously described generally applies to components in which a starting structure should have a conduction transition at a determined threshold. Especially, embodiments apply to structures of one-way or two-way Shockley diode type, and to various break-over components.

Of course, the present invention is likely to have various alterations, modifications, and improvements which will readily occur to those skilled in the art. Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A semiconductor device comprising:
   a first structure, the first structure comprising a p-type porous silicon layer arranged between two conductive regions, wherein a lower surface side of the porous silicon layer is contacted by a heavily-doped p-type semiconductor region and an upper surface side of the porous silicon layer is directly contacted by a metallization region; and
   a second structure, the second structure comprising a thyristor,
   wherein at least a portion of the thyristor is configured to turn on when a voltage applied across the porous silicon layer exceeds a threshold voltage.

2. The semiconductor device of claim 1, wherein the semiconductor device further comprises a substrate, wherein a first of the two conductive regions comprises the metallization region, wherein a second of the two conductive regions comprises the heavily-doped semiconductor region, and wherein the porous silicon layer is formed in an upper portion of the substrate.

3. The semiconductor device of claim 2, wherein:
   the substrate comprises a silicon substrate,
   the semiconductor device comprises a vertical semiconductor component forming a Shockley diode in the silicon substrate, and
   the Shockley diode comprises the first structure and the second structure.

4. The semiconductor device of claim 3, wherein:
   the second conductive region further comprises a doped conductive wall,
   the lower surface side of the porous silicon layer is connected via the doped conductive wall to an electrode formed on a lower surface of the Shockley diode, and
   the upper surface side of the porous silicon layer is connected by the metallization region to an upper surface well of the Shockley diode.

5. The semiconductor device of claim 1, wherein a porosity of the porous silicon layer is between 25% and 35%.

6. The semiconductor device of claim 5, wherein a thickness of the porous silicon layer is between 1.7 µm and 5.7 µm.

7. The semiconductor device of claim 6, wherein the first structure is configured to conduct current in accordance with Ohm's law when the voltage applied across the porous silicon layer does not exceed the threshold voltage, and wherein the first structure is configured to conduct current in accordance with Child's law when the voltage applied across the porous silicon exceeds the threshold voltage.

8. The semiconductor device of claim 1, wherein the threshold voltage is between 0.5 volts and 10 volts.

9. The semiconductor device of claim 1, wherein the thyristor includes two or more P-N junctions, and wherein the portion of the thyristor includes a first of the two or more P-N junctions.

10. The semiconductor device of claim 1, wherein the threshold voltage is a break-over voltage of a protection device comprising the first structure and the second structure.

11. The semiconductor device of claim 10, wherein the protection device is configured to conduct a first current of a first amplitude when the protection device is turned off, wherein the protection device is configured to conduct a second current of a second amplitude when the protection device is turned on, and wherein a ratio of the second amplitude to the first amplitude exceeds 1000.

12. A semiconductor device comprising:
    a thyristor; and
    a component comprising a p-type porous silicon layer and a heavily-doped p-type semiconductor region, wherein a lower surface side of the p-type porous silicon layer is contacted by the heavily-doped p-type semiconductor region and an upper surface side of the p-type porous silicon layer is directly contacted by a metallization region,
    wherein the component is coupled between an anode and a gate of the thyristor.

13. The semiconductor device of claim 12, wherein a porosity of the porous silicon layer is between 25% and 35%.

14. The semiconductor device of claim 12, wherein a thickness of the porous silicon layer is between 1.7 µm and 5.7 µm.

15. The semiconductor device of claim 12, wherein:
    the thyristor comprises: a first p-doped layer, a first n-doped layer disposed on the first p-doped layer, a second p-doped layer disposed on the first n-doped layer, and a second n-doped layer disposed on the second p-doped layer, and
    the porous silicon layer is coupled to the gate of the thyristor by the metallization region, the metallization region being connected to the second p-doped layer of the thyristor.

16. The semiconductor device of claim 15, wherein the porous silicon layer is formed in the first p-doped layer.

17. The semiconductor device of claim 12, wherein the thyristor is configured to turn on when a voltage applied across the porous silicon layer exceeds a threshold voltage.

18. A semiconductor device, comprising:
    a thyristor; and
    a component comprising a p-type porous silicon layer and a heavily-doped p-type semiconductor region, wherein a lower surface side of the p-type porous silicon layer is contacted by the heavily-doped p-type semiconductor region and an upper surface side of the p-type porous silicon layer is directly contacted by a metallization region, wherein the thyristor is configured to activate in response to a voltage applied across the porous silicon layer exceeding a threshold voltage of no more than 10 volts.

19. The semiconductor device of claim 18, wherein the porous silicon layer switches to a conduction state in which current is conducted in accordance with Child's law when the applied voltage exceeds the threshold voltage.

20. The semiconductor device of claim 18, wherein the threshold voltage is less than 5 volts.

21. The semiconductor device of claim 18, wherein the threshold voltage is less than 3 volts.

22. The semiconductor device of claim 18, wherein the threshold voltage is less than 1 volt.

23. The semiconductor device of claim 1, wherein the heavily-doped p-type semiconductor region contacts an electrode of the thyristor.

24. The semiconductor device of claim 1, wherein the threshold voltage depends on a depth of the heavily-doped p-type semiconductor region.

25. The semiconductor device of claim 12, wherein the heavily-doped p-type semiconductor region contacts the anode of the thyristor.

26. The semiconductor device of claim 17, wherein the threshold voltage depends on a depth of the heavily-doped p-type semiconductor region.

27. The semiconductor device of claim 18, wherein the heavily-doped p-type semiconductor region contacts an electrode of the thyristor.

28. The semiconductor device of claim 18, wherein the threshold voltage depends on a depth of the heavily-doped p-type semiconductor region.

* * * * *